(12) United States Patent
Cassia et al.

(10) Patent No.: US 10,177,723 B2
(45) Date of Patent: Jan. 8, 2019

(54) RECONFIGURABLE POWER AMPLIFIER

(71) Applicant: QUALCOMM Incorporated, San Diego, CA (US)

(72) Inventors: Marco Cassia, San Diego, CA (US); Jose Cabanillas, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 19 days.

(21) Appl. No.: 15/441,500

(22) Filed: Feb. 24, 2017

(65) Prior Publication Data

US 2018/0062592 A1 Mar. 1, 2018

Related U.S. Application Data

(60) Provisional application No. 62/381,482, filed on Aug. 30, 2016.

(51) Int. Cl.
*H03F 3/217* (2006.01)
*H03F 1/56* (2006.01)
(Continued)

(52) U.S. Cl.
CPC .......... *H03F 3/217* (2013.01); *H03F 1/0277* (2013.01); *H03F 1/56* (2013.01); *H03F 1/565* (2013.01); *H03F 3/19* (2013.01); *H03F 3/211* (2013.01); *H03F 3/72* (2013.01); *H03G 1/00* (2013.01); *H03F 1/0288* (2013.01); *H03F 3/2171* (2013.01); *H03F 3/2173* (2013.01); *H03F 2200/222* (2013.01); *H03F 2200/318* (2013.01); *H03F 2200/387* (2013.01); *H03F 2200/408* (2013.01); *H03F 2200/411* (2013.01); *H03F 2200/451* (2013.01);
(Continued)

(58) Field of Classification Search
CPC .......... H03F 1/0288; H03F 1/07; H03F 3/211; H03F 3/602; H03F 3/605; H03F 3/68; H03F 3/604; H03F 1/0277; H03F 3/72; H03F 1/0088; H03G 1/0088
USPC ........................................ 330/51, 124 R, 295
See application file for complete search history.

(56) References Cited

U.S. PATENT DOCUMENTS 7,863,979 B2 1/2011 Chung et al.
8,149,050 B2 * 4/2012 Cabanillas ............ H03F 1/0277
330/302

(Continued)

OTHER PUBLICATIONS

International Search Report and Written Opinion—PCT/US2017/044939—ISA/EPO—dated Oct. 12, 2017.
Hu S., et al., "Design of a Transformer-Based Reconfigurable Digital Polar Doherty Power Amplifier Fully Integrated in Bulk CMOS", IEEE Journal of Solid-State Circuits, May 2015, vol. 50, No. 5, pp. 1094-1106.

*Primary Examiner* — Khanh V Nguyen
(74) *Attorney, Agent, or Firm* — Procopio, Cory, Hargreaves & Savitch LLP/Qualcomm (57) ABSTRACT

A power amplifier circuit, including: an input node configured to receive a radio frequency (RF) signal; an output node configured to output an amplified RF signal; a main path switchably coupled between the input node and the output node, and including a first plurality of amplification stages to generate a first amplified RF signal; a bypass path switchably coupled between the input node and the output node, and including at least one second amplification stage to generate a second amplified RF signal; and a coupling switch configured to reuse at least a portion of the bypass path to drive the main path to generate a third amplified RF signal.

27 Claims, 9 Drawing Sheets

(51) Int. Cl.
*H03F 3/19* (2006.01)
*H03F 3/21* (2006.01)
*H03F 3/72* (2006.01)
*H03G 1/00* (2006.01)
*H03F 1/02* (2006.01)
*H04B 1/40* (2015.01)
*H04B 1/401* (2015.01)

(52) U.S. Cl.
CPC ............... *H03F 2203/21103* (2013.01); *H03F 2203/21136* (2013.01); *H03F 2203/21139* (2013.01); *H03F 2203/21175* (2013.01); *H03F 2203/7215* (2013.01); *H03F 2203/7221* (2013.01); *H03F 2203/7236* (2013.01); *H04B 1/40* (2013.01); *H04B 1/401* (2013.01)

(56) References Cited

U.S. PATENT DOCUMENTS

| | | | |
|---|---|---|---|
| 8,634,782 B2 * | 1/2014 | Asuri | H04B 1/0064 455/101 |
| 8,666,338 B2 * | 3/2014 | Zhao | H03F 1/0277 330/124 R |
| 9,160,377 B2 | 10/2015 | Lee et al. | |
| 9,231,536 B2 | 1/2016 | Dupuy et al. | |
| 2007/0018720 A1 | 1/2007 | Wright | |
| 2011/0037516 A1 | 2/2011 | Nejati et al. | |
| 2011/0115565 A1 | 5/2011 | Cabanillas | |
| 2013/0095895 A1 | 4/2013 | Asuri et al. | |

* cited by examiner

RECONFIGURABLE POWER AMPLIFIER

CROSS-REFERENCE TO RELATED APPLICATIONS

This application claims the benefit of priority under 35 U.S.C. § 119(e) of co-pending U.S. Provisional Patent Application No. 62/381,482, filed Aug. 30, 2016, entitled "Reconfigurable Power Amplifier."

BACKGROUND

Field

This disclosure relates generally to power amplifiers, and more specifically, to reconfigurable power amplifiers for use in transceivers.

Background

Demands for low-power transceivers have been increasing for multi-standard wireless communications. As the power of the transceiver is reduced to meet linearity requirements (e.g., intermodulation distortion (IMD) and spectral emission mask (SEM)), the gain of the power amplifier (PA) needs to be increased to meet the required output power. Since the gain and the linearity do not typically follow the same optimization strategy, the linearity may need to be sacrificed to meet the end-to-end gain. This may be particularly true for the two-stage PA where the input stage provides a limited gain and serves cancellation purposes (e.g. a source-follower driving PA).

SUMMARY

The present disclosure describes a method to reuse the existing bypass path to drive the main path of the PA when extra gain is needed.

In one embodiment, a power amplifier circuit is disclosed. The power amplifier circuit includes: an input node configured to receive a radio frequency (RF) signal; an output node configured to output an amplified RF signal; a main path switchably coupled between the input node and the output node, and including a first plurality of amplification stages to generate a first amplified RF signal; a bypass path switchably coupled between the input node and the output node, and including at least one second amplification stage to generate a second amplified RF signal; and a coupling switch configured to reuse at least a portion of the bypass path to drive the main path to generate a third amplified RF signal In another embodiment, a power amplification method is disclosed. The method includes: receiving an RF signal at an input node; amplifying the RF signal by selecting at least one path from both (1) at least a portion of a main path of a first plurality of amplification stages and (2) and at least a portion of a bypass path of at least one second amplification stage; and outputting an amplified RF signal amplified by the selected at least one path from an output node.

In another embodiment, a power amplification system including a plurality of power amplifier (PA) circuits is disclosed. Each PA circuit includes: an input node configured to receive an RF signal; an output node configured to output an amplified RF signal; a main path coupled between the input node and the output node, and including a first plurality of amplification stages to generate a first amplified RF signal; a shared bypass path configured to be shared among main paths of the plurality of PA circuits, the shared bypass path including at least one second amplification stage to generate a second amplified RF signal; and a coupling switch configured to reuse the shared bypass path to drive the main path to generate a third amplified RF signal.

Other features and advantages of the present disclosure should be apparent from the present description which illustrates, by way of example, aspects of the disclosure.

BRIEF DESCRIPTION OF THE DRAWINGS

The details of the present disclosure, both as to its structure and operation, may be gleaned in part by study of the appended further drawings, in which like reference numerals refer to like parts, and in which.

DETAILED DESCRIPTION

As explained above, the linearity may need to be sacrificed to meet the end-to-end gain. However, in most implementations, the increase in the power amplifier gain may only be necessary for some specific bands covered by the PA (e.g. the low-band PA needs to increase the gain for band B13 emissions). Certain implementations of the present disclosure are configured to reuse the existing bypass path to drive the main path of the PA when extra gain is needed. Thus, by reusing the existing bypass path to drive the main path of the PA, the gain versus linearity parameter can be independently tuned with little overhead (e.g., extra switches and the control of the extra switches).

After reading this description it will become apparent how to implement the disclosure in various implementations and applications. Although various implementations of the present disclosure will be described herein, it is understood that these implementations are presented by way of example only, and not limitation. As such, this detailed description of various implementations should not be construed to limit the scope or breadth of the present disclosure.

Figure 1:
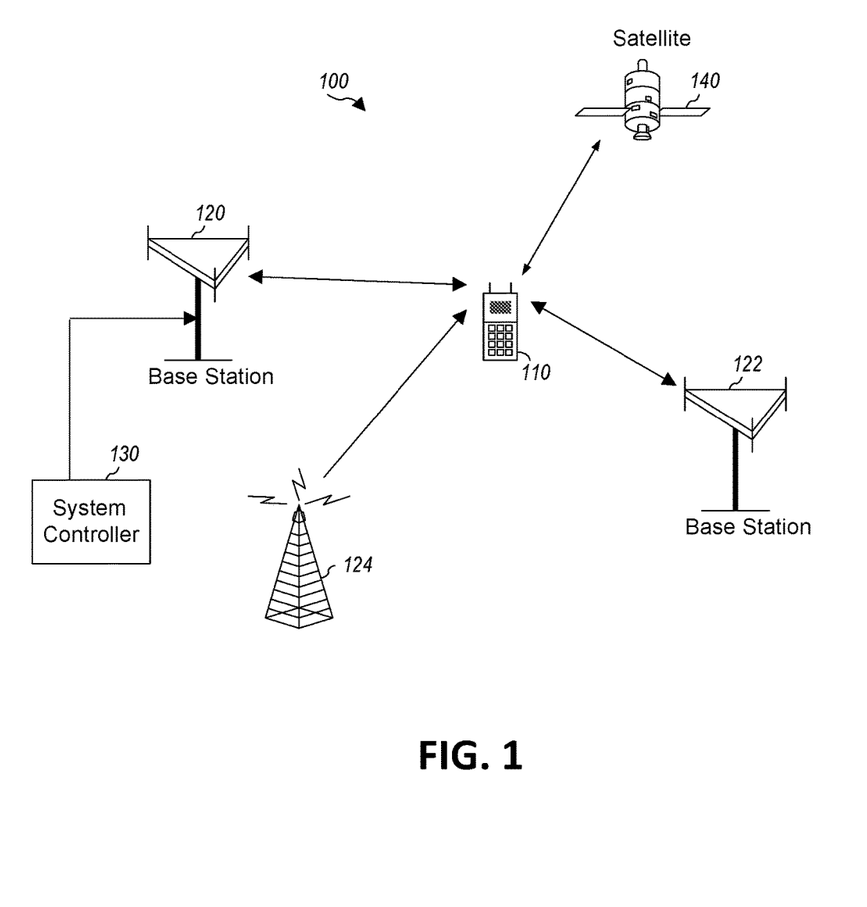
FIG. 1 is a wireless device communicating with a wireless communication system.

FIG. 1 shows a wireless device 110 communicating with a wireless communication system 100. Wireless communication system 100 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 100 including two base stations 120 and 122 and one system controller 130. In general, a wireless system may include any number of base stations and any set of network entities.

Wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 100. Wireless device 110 may also receive signals from broadcast stations (e.g., broadcast station 124), signals from satellites (e.g., satellite 140) in one or more global navigation satellite systems (GNSS), etc. Wireless device 110 may support one or more radio technologies for wireless communication including LTE, WCDMA, CDMA 1X, EVDO, TD-SCDMA, GSM, 802.11, etc.

Figure 2:
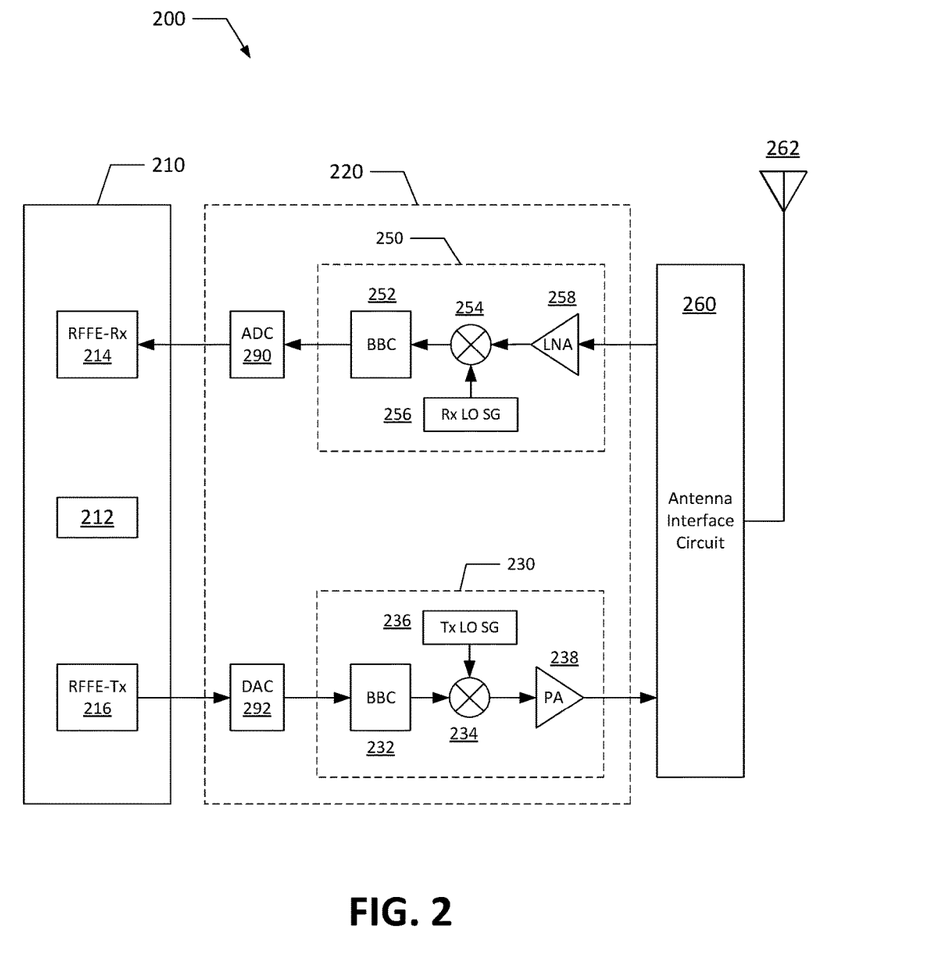
FIG. 2 is a functional block diagram of a wireless device that is one implementation of the wireless device of FIG. 1.

FIG. 2 is a functional block diagram of a wireless device 200 that is one implementation of a wireless device 110 of FIG. 1. In this design, the wireless device 200 includes a transceiver 220 coupled to an antenna 262 through an antenna interface circuit 260, and a data processor/controller 210. The transceiver 220 includes, among other blocks, a receiver 250 and a transmitter 230 to support bi-directional communication. The antenna interface circuit 260 couples the antenna 262 to either the transmitter 230 or receiver 250.

In FIG. 2, the transceiver 220 also includes an analog-to-digital converter (ADC) 290 and a digital-to-analog converter (DAC) 292. The ADC 290 converts the analog input signal received from the receiver 250 to the digital data. The DAC 292 converts the digital data generated in the data processor/controller 210 to an analog output signal and provides the converted analog output signal to the transmitter 230. In general, the wireless device 200 may include any number of transmitters and receivers for any number of communication systems and frequency bands.

The data processor/controller 210 includes a memory unit 212 to store data and program codes. The data processor/controller 210 may perform various functions for the wireless device 200. For example, the data processor/controller 210 may perform processing for data being received via the receiver 250 and data being transmitted via the transmitter 230. The data processor/controller 210 may also control the operation of various circuits within the transceiver 220. The data processor/controller 210 may be implemented on one or more application specific integrated circuits (ASICs) and/or other integrated circuits (ICs).

The data processor/controller 210 also includes a digital baseband receiver radio frequency (RF) front-end processor (RFFE-Rx) 214 and a digital baseband transmitter RF front-end processor (RFFE-Tx) 216. The RFFE-Rx 214 processes the digital baseband signal received from the ADC 290, while the RFFE-Tx 216 processes the digital baseband signal transmitted to the DAC 292.

In FIG. 2, the receiver 250 includes a low noise amplifier (LNA) 258, a mixer/downconverter 254, a receiver local oscillator signal generator (Rx LO SG) 256, and a first baseband circuitry 252, which may include baseband amplifiers and/or filters. The Rx LO SG 256 in the receiver 250 receives a clock signal from a crystal oscillator through a receiver phase locked loop (not shown). The Rx LO SG 256 may include a frequency divider that receives the clock signal and provides a divider output signal. The clock signal may be generated by a voltage-controlled oscillator (VCO) or some other types of oscillator. The clock signal may also be referred to as a VCO signal, an oscillator signal, etc.

For data reception, antenna 262 receives signals from base stations and/or other transmitter stations and provides a received RF signal, which is routed through an antenna interface circuit 260 and presented as an input RF signal to the receiver 250. The antenna interface circuit 260 may include switches, duplexers, transmit filters, receive filters, match networks, etc. Within the receiver 250, the LNA 258 amplifies the input RF signal and provides an output RF signal to the mixer/downconverter 254. The Rx LO SG 256 generates a local oscillator signal. The mixer/downconverter 254 mixes the output RF signal with the generated local oscillator signal to downconvert the output RF signal from RF to baseband. The first baseband circuitry 252 amplifies and/or filters the baseband signal to provide an analog input signal to the ADC 290, which converts the analog input signal to the digital baseband signal and sends the digital signal to RFFE-Rx 214 in the data processor/controller 210. The receiver 250 may include other elements such as match networks, an oscillator, etc. In one implementation, ADC 290 may be implemented with a successive approximation register (SAR) ADC.

In FIG. 2, the transmitter 230 includes a second baseband circuitry 232, a mixer/upconverter 234, a transmitter local oscillator signal generator (Tx LO SG) 236, and a power amplifier (PA) 238. The second baseband circuitry 232 may include baseband amplifiers and/or filters. The Tx LO SG 236 in the transmitter 230 receives a clock signal from a crystal oscillator through a transmitter phase locked loop (not shown). The Tx LO SG 236 may include a frequency divider that receives the clock signal and provides a divider output signal. The clock signal may be generated by a voltage-controlled oscillator (VCO) or some other types of oscillator. The clock signal may also be referred to as a VCO signal, an oscillator signal, etc.

For data transmission, the RFFE-Tx 216 in the data processor/controller 210 processes (e.g., encodes and modulates) data to be transmitted and provides a digital data to the DAC 292. The DAC 292 converts the digital data to a baseband analog output signal and provides the converted analog output signal to the transmitter 230, which generates a transmit RF signal. Within the transmitter, the second baseband circuitry 232 filters and/or amplifies the baseband analog signal received from the DAC 292 and sends the filtered signal to the mixer/upconverter 234. The Tx LO SG 236 generates a local oscillator signal. The mixer/upconverter 234 mixes the filtered baseband signal with the generated local oscillator signal to upconvert the baseband signal to the RF signal. The power amplifier (PA) 238 amplifies the RF signal sufficiently to drive the antenna 262. The amplified RF signal is routed through the antenna interface circuit 260 and transmitted via antenna 262. The transmitter 230 may include other elements such as match networks, an oscillator, etc.

Figure 3A:
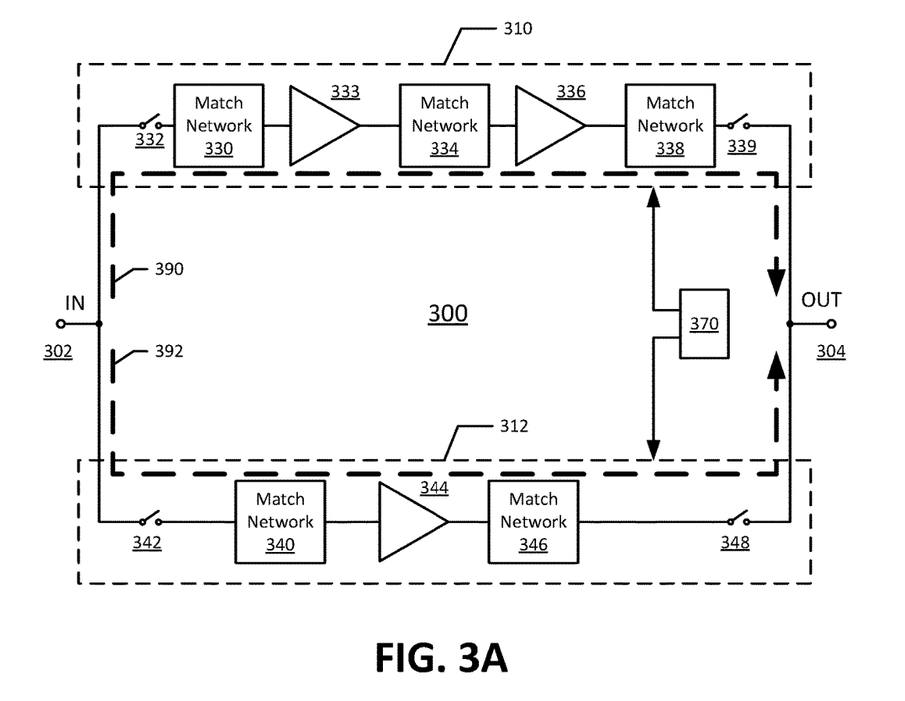
FIG. 3A is a functional block diagram of a power amplifier architecture (PAA) (performing substantially similar functions as the PA in FIG. 2) configured with a plurality of paths in accordance with one embodiment of the present disclosure.

FIG. 3A is a functional block diagram of a power amplifier architecture (PAA) 300 configured with a plurality of paths in accordance with one embodiment of the present disclosure. The PAA 300 of FIG. 3A performs substantially similar functions as those of the PA 238 in FIG. 2.

In the illustrated embodiment of FIG. 3A, the PAA 300 is configured with a main path 310 and a bypass path 312. The main path 310 and the bypass path 312 are coupled at the input node 302 for receiving an input RF signal and are coupled at the output node 304 for outputting an amplified RF signal that is output to the antenna.

In the illustrated embodiment of FIG. 3A, the main path 310 is a two-stage path, which includes two amplifiers 333, 336. The main path 310 may be configured according to a first desired use scenario. For example, the main path may be configured to be used for high-power mode. The main path 310 also includes match networks including an input match network 330, an inter-stage match network 334, and an output match network 338. A match network is a passive network used to match the impedance of a target. For example, the output match network 338 is a passive network configured to match the output node 304 of the PAA 300, which matches the antenna impedance (e.g., 50-ohm).

In the illustrated embodiment of FIG. 3A, the bypass path 312 is a single-stage path, which includes an amplifier 344. The bypass path 312 may be configured according a second desired use scenario. For instance, the bypass path 312 may be configured to be used for low-power mode. The bypass path 310 also includes match networks including an input match network 340 and an output match network 346. It should be noted that although the description indicates a two-stage main path and a single-stage bypass path, any number of stages of amplification can be configured for both the main path and the bypass path.

Figure 3B:
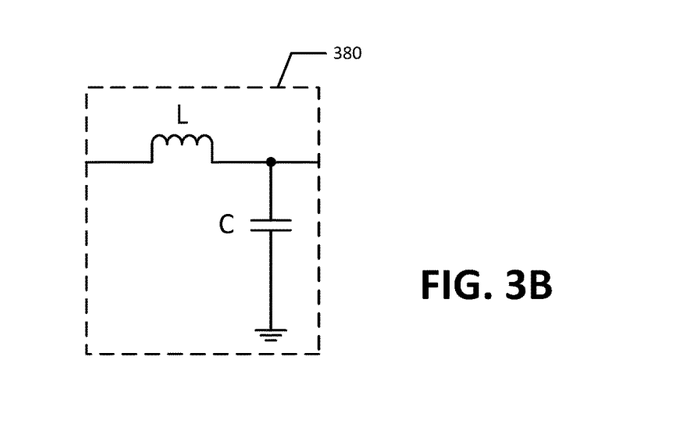
FIG. 3B is a detailed schematic diagram of a match network that is one implementation of any one of the match networks of FIG. 3A.

FIG. 3B is a detailed schematic diagram of a match network 380 that is one implementation of any one of the match networks 330, 334, 338, 340, 346 of FIG. 3A. In FIG. 3B, the match network 380 configured with an inductor L and a capacitor C. However, in other implementations, a match network 380 can be configured with any combination of inductors, capacitors, resistors, transformers, and/or a hardwire connection from the input to the output (meaning that the match network 380 can be replaced/removed).

Referring back to FIG. 3A, to use the main path 310 of the PAA 300, switches 332, 339 in the main path 310 are turned on (i.e., closed), while switches 342, 348 in the bypass path 312 are turned off (i.e., open). Thus, the position of the switches 332, 339, 342, 348 as indicated above (i.e., switches 332, 339 turned on and switches 342, 348 turned off) routes the input RF signal through the signal path 390 as shown. In the illustrated embodiment of FIG. 3A, the switches are controlled by control signals from a controller 370.

In contrast, to use the bypass path 312 of the PAA 300, switches 332, 339 in the main path 310 are turned off (i.e., open), while switches 342, 348 in the bypass path 312 are turned on (i.e., closed). Thus, the position of the switches 332, 339, 342, 348 as indicated above (i.e., switches 332, 339 turned off and switches 342, 348 turned on) routes the input RF signal through the signal path 392 as shown.

Figure 4:
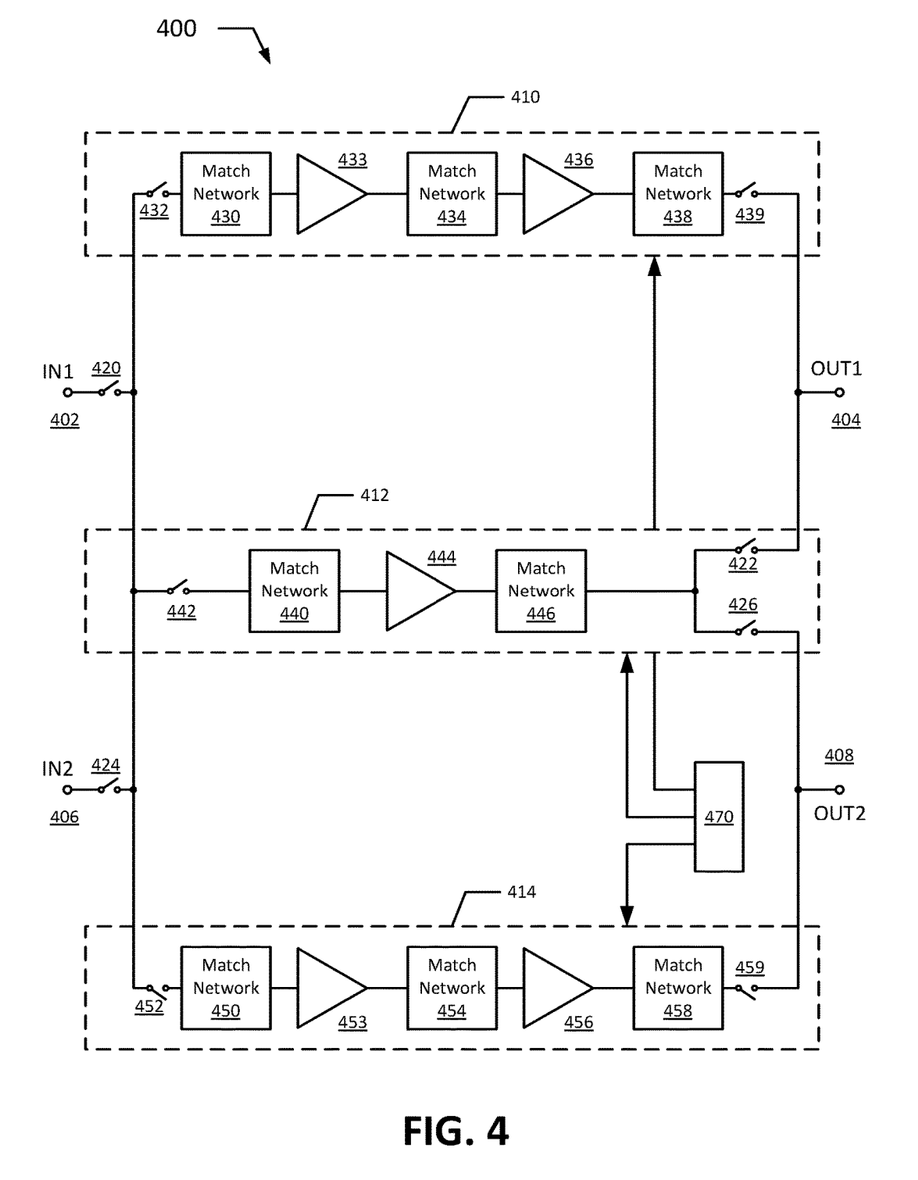
FIG. 4 is a functional block diagram of a pair of power amplifier architectures (PAAs) in which each PAA includes a plurality of paths but with a shared bypass path in accordance with one embodiment of the present disclosure.

FIG. 4 is a functional block diagram of a pair of power amplifier architectures (PAAs) 400 in which each PAA includes a plurality of paths but with a shared bypass path in accordance with one embodiment of the present disclosure. In the illustrated embodiment of FIG. 4, the PAAs 400 include a first PAA having a main path 410 and a bypass path 412 and a second PAA having a main path 414 and the bypass path 412, which is shared with the first PAA. The first PAA receives the input RF signal at node 402 and outputs the amplified RF signal at node 404. The second PAA receives the input RF signal at node 406 and outputs the amplified RF signal at node 408.

In FIG. 4, the sharing of the bypass path 412 is performed with switches 420, 422, 424, 426. When the first PAA is selected, switches 420, 422 are turned on (i.e., closed), while switches 424, 426 are turned off (i.e., open). This allows the first PAA to use the bypass path 412. When the second PAA is selected, switches 420, 422 are turned off (i.e., open), while switches 424, 426 are turned on (i.e., closed). This allows the second PAA to use the bypass path 412. Again, the switches 420, 422, 424, 426 are controlled by control signals from a controller 470. Operations of all other switches 432, 439, 442, 452, 459, amplifiers 433, 436, 444, 453, 456, and match networks 430, 434, 438, 440, 446, 450, 454, 458 in FIG. 4 are similarly controlled as described with respect to switches, amplifiers, and match networks in FIG. 3A.

Figure 5A:
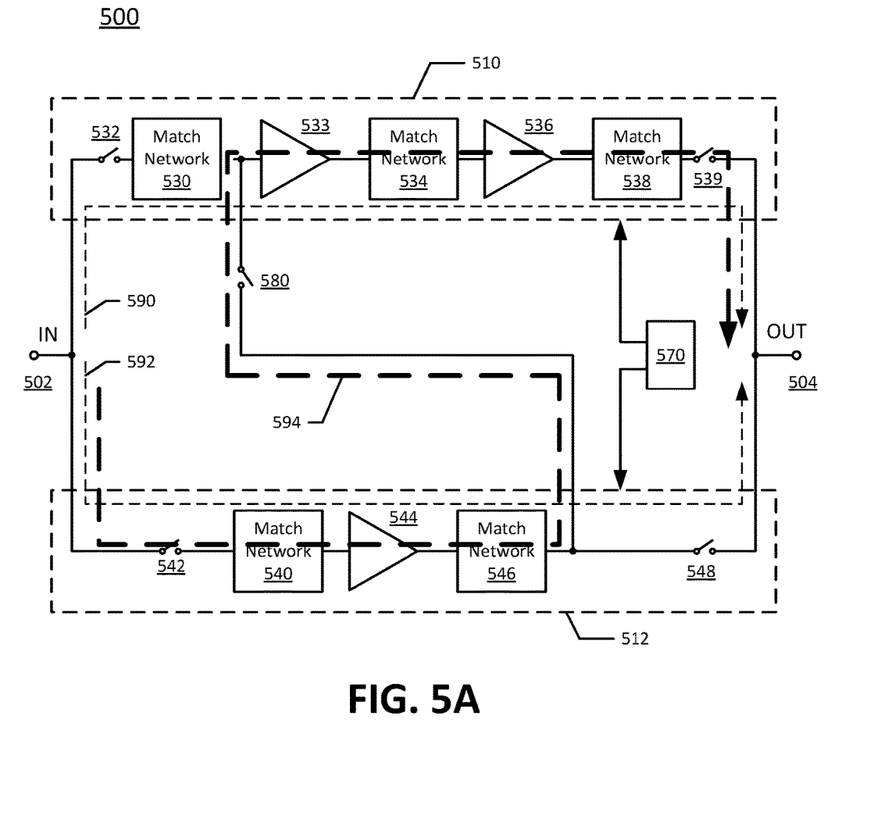
FIG. 5A is a functional block diagram of a PAA configured with a plurality of paths in accordance with another embodiment of the present disclosure.

FIG. 5A is a functional block diagram of a PAA 500 configured with a plurality of paths in accordance with another embodiment of the present disclosure. In the illustrated embodiment of FIG. 5A, the PAA 500 is configured with two physical paths, a main path 510 and a bypass path 512. The PAA 500 of FIG. 5A is configured to produce three signal paths 590, 592, 594.

In FIG. 5A, to use the main path 510 of the PAA 500, switches 532, 539 in the main path 510 are turned on (i.e., closed), while switches 542, 548 in the bypass path 512 are turned off (i.e., open). Thus, the position of the switches 532, 539, 542, 548 as indicated above (i.e., switches 532, 539 turned on and switches 542, 548 turned off) routes the input RF signal through the signal path 590 as shown. In the illustrated embodiment of FIG. 5A, the switches are controlled by control signals from a controller 570.

In contrast, to use the bypass path 512 of the PAA 500, switches 532, 539 in the main path 510 are turned off (i.e., open), while switches 542, 548 in the bypass path 512 are turned on (i.e., closed). Thus, the position of the switches 532, 539, 542, 548 as indicated above (i.e., switches 532, 539 turned off and switches 542, 548 turned on) routes the input RF signal through the signal path 592 as shown. Again, the main path 510 and the bypass path 512 are coupled at the input node 502 for receiving an input RF signal and are coupled at the output node 504 for outputting an amplified RF signal that is output to the antenna.

Further, the PAA 500 is configured to provide an additional signal path (a "reuse" path) 594 by reusing the bypass path 512 to drive the main path 510 when extra gain is needed. For example, to generate the extra gain in the PAA 500, switch 539 in the main path 510 is turned on (i.e., closed), switch 542 in the bypass path 512 is turned on (i.e., closed), and coupling switch 580 is turned on (i.e., closed). Switch 532 in the main path and switch 548 in the bypass path are turned off (i.e., open). The switch 580 connects the output of the bypass path 512 (at the output of the match network 546) to the input of the main path 510 (at the input of the amplifier 533). Thus, the position of the switches 532, 539, 542, 548, 580 as indicated above (i.e., switches 539, 542, 580 turned on and switches 532, 548 turned off) routes the input RF signal through the signal path 594 as shown. The signal path 594 routes the input RF signal through three stages of amplification. That is, the input RF signal is routed through an input match network 540, an amplifier 544, an output match network 546, an amplifier 533, an inter-stage match network 534, an amplifier 536, and an output match network 538. Again, the switches 532, 539, 542, 548, 580 are controlled by control signals from a controller 570. The input match network 530 is used for the signal path 590, but is not used for signal path 594. In one embodiment, an amplification stage includes one amplifier. In another embodiment, an amplification stage includes more than one amplifier.

Figure 5B:
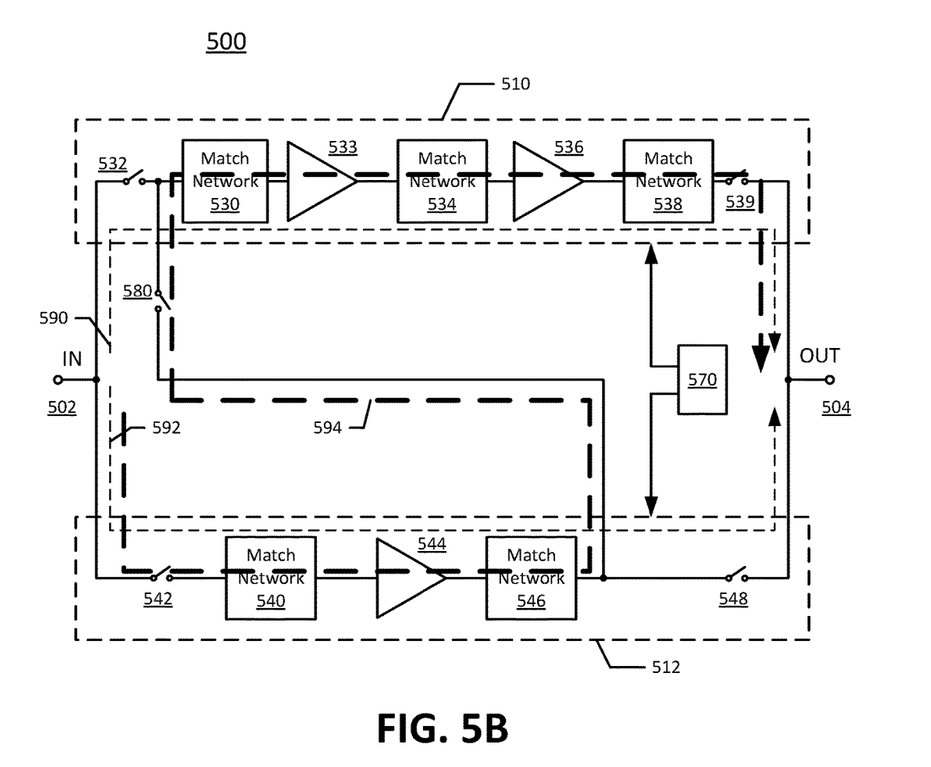
FIG. 5B is a functional block diagram of a PAA configured with a plurality of paths in accordance with an alternative embodiment of the present disclosure.

FIG. 5B is a functional block diagram of a PAA 500 configured with a plurality of paths in accordance with an alternative embodiment of the present disclosure. The difference between the embodiments of FIG. 5A and FIG. 5B is that, in FIG. 5B, the input RF signal is routed through an input match network 540 of the bypass path, an amplifier 544, an output match network 546 of the bypass path, an input match network 530 of the main path, an amplifier 533, an inter-stage match network 534, an amplifier 536, and an output match network 538. That is, the input to the main stage 510 is coupled to the input of the input match network 530 in FIG. 5B, in contrast to FIG. 5A, where the input to the main stage 510 is coupled to the output of the input match network 530. Thus, the input match network 530 is used for both signal paths 590, 594.

Figure 6:
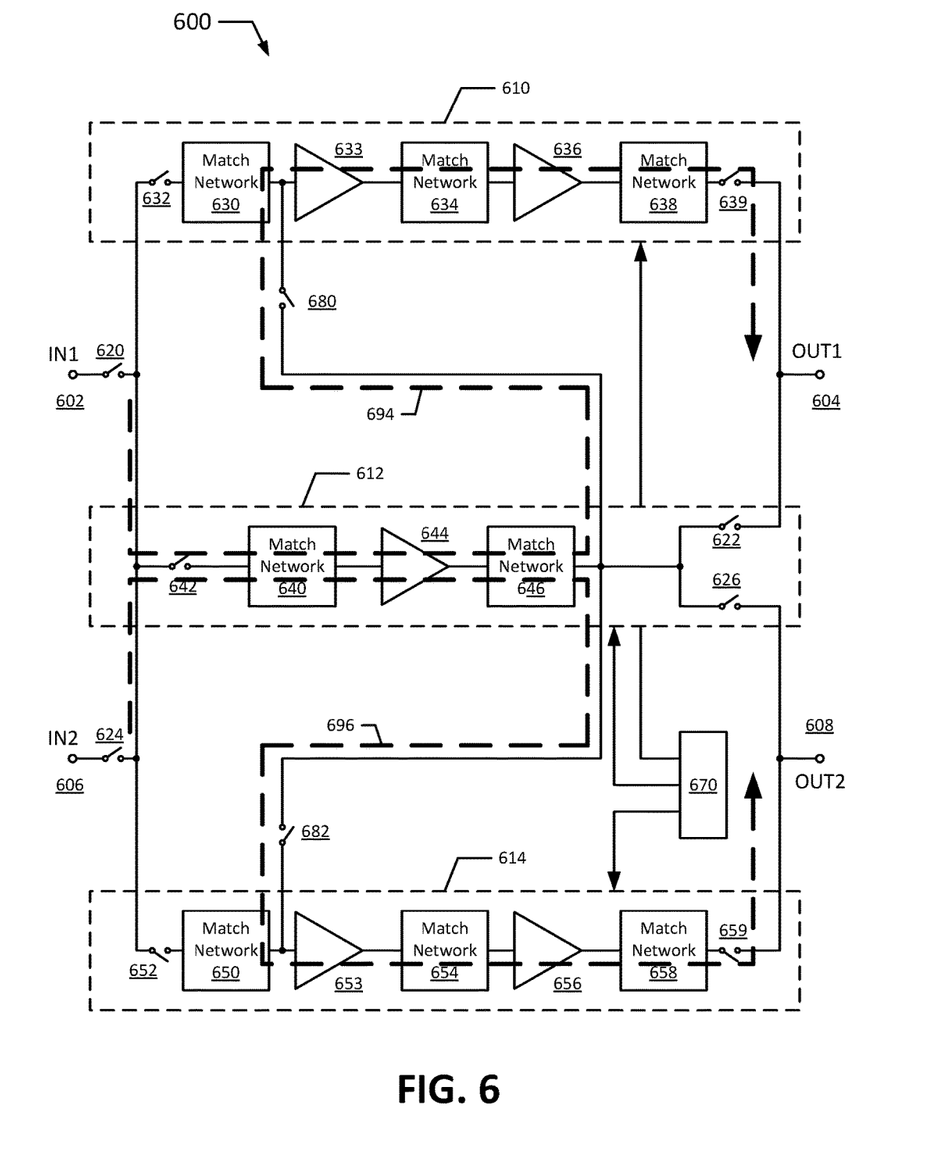
FIG. 6 is a functional block diagram of a pair of PAAs in which each PAA includes a plurality of paths but with a shared bypass path in accordance with another embodiment of the present disclosure.

FIG. 6 is a functional block diagram of a pair of PAAs 600 in which each PAA includes a plurality of paths but with a shared bypass path in accordance with another embodiment of the present disclosure. The PAAs 600 include a first PAA having a main path 610 and a shared bypass path 612 and a second PAA having a main path 614 and the shared bypass path 612. Further, each of the first and second PAAs is configured to produce three signal paths similar to signal paths 590, 592, 594 in FIG. 5A.

In the illustrated embodiment of FIG. 6, the first PAA receives the input RF signal at node 602 through switch 620 and outputs the amplified RF signal at node 604. The second PAA receives the input RF signal at node 606 through switch 624 and outputs the amplified RF signal at node 608. In FIG. 6, the sharing of the bypass path 612 is performed with switches 620, 622, 624, 626. When the first PAA is selected, switches 620, 622 are turned on (i.e., closed), while switches 624, 626 are turned off (i.e., open). This allows the first PAA to use the bypass path 612. When the second PAA is selected, switches 620, 622 are turned off (i.e., open), while switches 624, 626 are turned on (i.e., closed). This allows the second PAA to use the bypass path 612. Again, the switches 620, 622, 624, 626 are controlled by control signals from a controller 670. Operations of all other switches 632, 639, 642, 652, 659, amplifiers 633, 636, 644, 653, 656, and match networks 630, 634, 638, 640, 646, 650, 654, 658 in FIG. 6 are similarly controlled as described with respect to switches, amplifiers, and match networks in FIG. 3A.

Further, the first PAA of the PAAs 600 is configured to provide an additional signal path 694 by reusing the shared bypass path 612 to drive the main path 610 when extra gain is needed. For example, to generate the extra gain in the first PAA, switch 639 in the main path 610 is turned on (i.e., closed), switch 642 in the bypass path 612 is turned on (i.e., closed), coupling switch 680 is turned on (i.e., closed), and coupling switch 682 is turned off (i.e., open). The coupling switch 680 connects the output of the bypass path 612 (at the output of the match network 646) to the input of the main path 610 (at the input of the amplifier 633). Thus, the position of the switches 632, 639, 642, 622, 680 as indicated above (i.e., switches 639, 642, 680 turned on and switches 632, 622 turned off) routes the input RF signal through an extra signal path 694 as shown. The extra signal path 694 routes the input RF signal through three stages of amplification. That is, the input RF signal is routed through an input match network 640, an amplifier 644, an output match network 646, an amplifier 633, an inter-stage match network 634, an amplifier 636, and an output match network 638. Again, the switches 632, 639, 642, 622, 680 are controlled by control signals from a controller 670.

Further, the second PAA of the PAAs 600 is configured to provide an additional signal path 696 by reusing the shared bypass path 612 to drive the main path 614 when extra gain is needed. For example, to generate the extra gain in the second PAA, switch 659 in the main path 614 is turned on (i.e., closed), switch 642 in the bypass path 612 is turned on (i.e., closed), coupling switch 680 is turned off (i.e., open), and coupling switch 682 is turned on (i.e., closed). The coupling switch 682 connects the output of the bypass path 612 (at the output of the match network 646) to the input of the main path 614 (at the input of the amplifier 653). Thus, the position of the switches 652, 659, 642, 626, 682 as indicated above (i.e., switches 659, 642, 682 turned on and switches 652, 626 turned off) routes the input RF signal through an extra signal path 696 as shown. The extra signal path 696 routes the input RF signal through three stages of amplification. That is, the input RF signal is routed through an input match network 640, an amplifier 644, an output match network 646, an amplifier 653, an inter-stage match network 654, an amplifier 656, and an output match network 658. Again, the switches 652, 659, 642, 626, 682 are controlled by control signals from a controller 670. The input match network 650 is not used for signal path 696.

Figure 7:
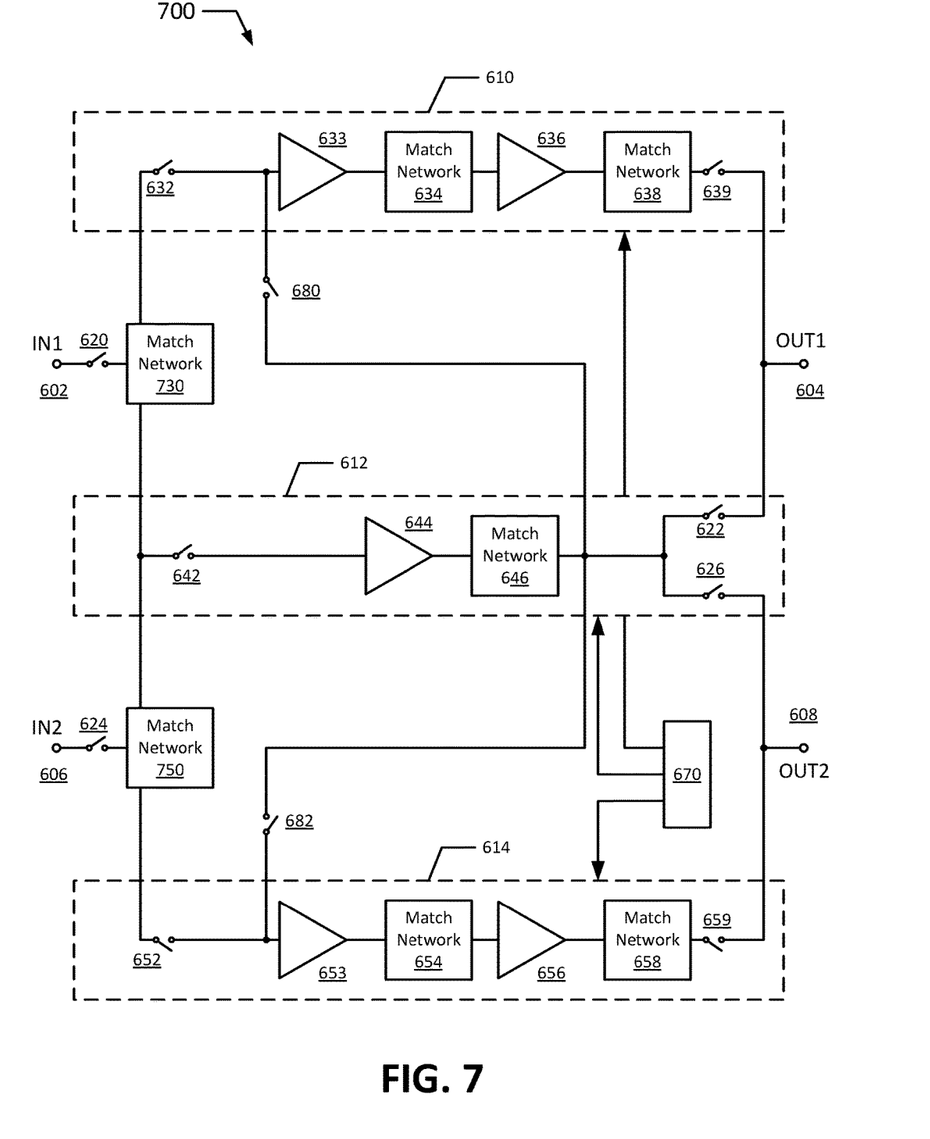
FIG. 7 is a functional block diagram of a pair of PAAs in which each PAA includes a plurality of paths but with a shared bypass path in accordance with yet another embodiment of the present disclosure.

FIG. 7 is a functional block diagram of a pair of PAAs 700 in which each PAA includes a plurality of paths but with a shared bypass path in accordance with yet another embodiment of the present disclosure. In the illustrated embodiment of FIG. 7, the input match networks 630, 640 in the main path 610 and the bypass path 612, respectively, of FIG. 6 are replaced with a single input match network 730 which is configured to perform the matching for both the main path 610 and the bypass path 612. Similarly, the input match networks 650, 640 in the main path 614 and the bypass path 612, respectively, of FIG. 6 are replaced with a single input match network 750 which is configured to perform the matching for both the main path 614 and the bypass path 612.

Figure 8:
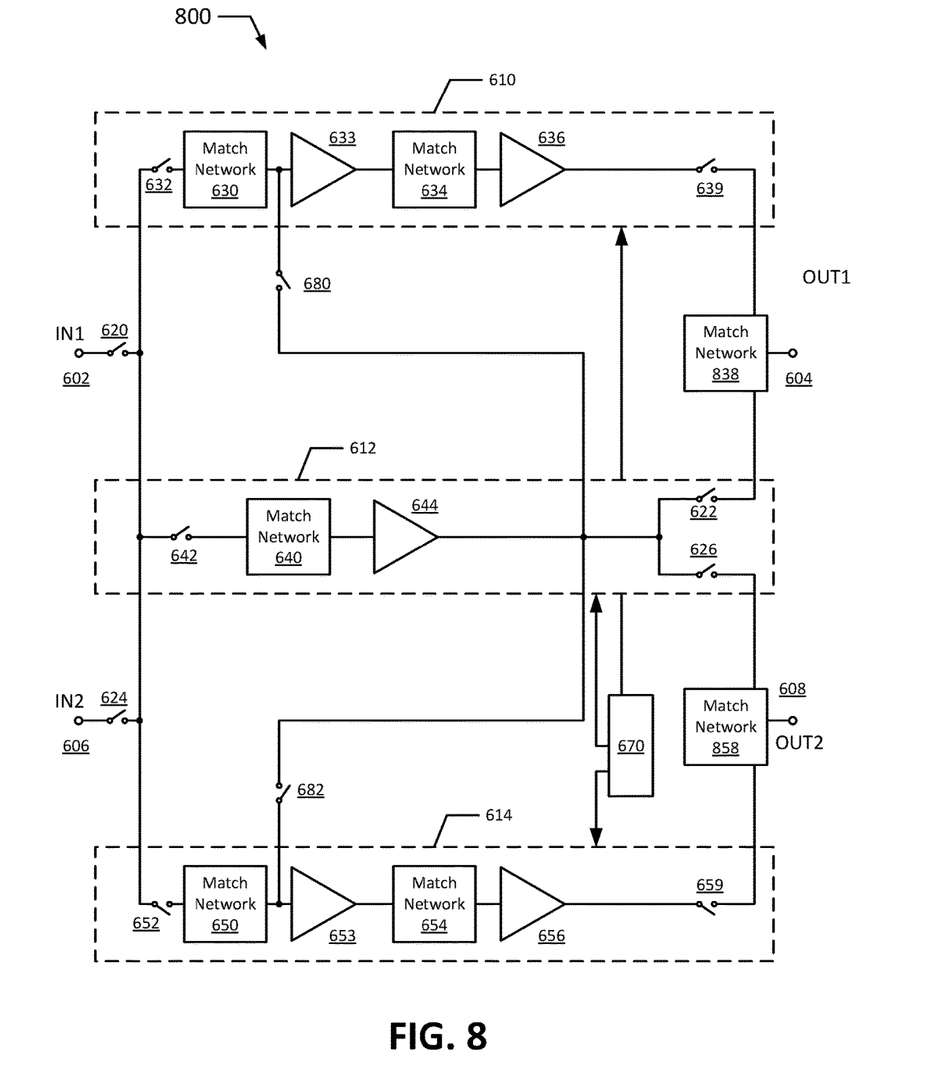
FIG. 8 is a functional block diagram of a pair of PAAs in which each PAA includes a plurality of paths but with a shared bypass path in accordance with yet another embodiment of the present disclosure.

FIG. 8 is a functional block diagram of a pair of PAAs 800 in which each PAA includes a plurality of paths but with a shared bypass path in accordance with yet another embodiment of the present disclosure. In the illustrated embodiment of FIG. 8, the output match networks 638, 646 in the main path 610 and the bypass path 612, respectively, of FIG. 6 are replaced with a single output match network 838 which is configured to perform the output matching for both the main path 610 and the bypass path 612. Similarly, the output match networks 658, 646 in the main path 614 and the bypass path 612, respectively, of FIG. 6 are replaced with a single output match network 858 which is configured to perform the output matching for both the main path 614 and the bypass path 612.

Those of skill in the art will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the disclosure. In addition, the grouping of functions within a module, block, or step is for ease of description. Specific functions or steps can be moved from one module or block without departing from the disclosure.

The above description of the disclosed embodiments is provided to enable any person skilled in the art to make or use the disclosure. Various modifications to these embodiments will be readily apparent to those skilled in the art, and the generic principles described herein can be applied to other embodiments without departing from the spirit or scope of the disclosure. For example, although the description of the PAAs indicates a two-stage main path and a single-stage bypass path, any number of stages of amplification can be configured for both the main path and the bypass path, and any number of PAAs can be configured to share a fixed number of bypass paths. Further, the above-described configurations of the PAAs can be used in other amplifier architectures, for example, in low-noise amplifiers. Thus, it is to be understood that the description and drawings presented herein represent presently preferred embodiments of the disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

What is claimed is:

1. A power amplifier circuit, comprising:
   an input node configured to receive a radio frequency (RF) signal;
   an output node configured to output an amplified RF signal;
   a main path switchably coupled between the input node and the output node, and including a first plurality of amplification stages to generate a first amplified RF signal;
   a bypass path switchably coupled between the input node and the output node, and including at least one second amplification stage to generate a second amplified RF signal; and
   a coupling switch configured to reuse at least a portion of the bypass path to drive at least a portion of the main path to generate a third amplified RF signal, the at least a portion of the main path including at least one amplification stage of the first plurality of amplification stages.

2. The circuit of claim 1, wherein each of the main path and the bypass path comprises
   a plurality of switches configured to enable one of the main path or bypass path and disable the other of the main path or bypass path.

3. The circuit of claim 2, further comprising
   a controller configured to control the plurality of switches to select one of the main path or bypass path.

4. The circuit of claim 1, wherein each of the main path and the bypass path comprises
   a plurality of switches configured to enable the main path and the bypass path.

5. The circuit of claim 4, further comprising
   a controller configured to control the plurality of switches and the coupling switch to select a reuse path comprising at least a portion of the main path and the at least portion of the bypass path.

6. The circuit of claim 5, wherein the reuse path is configured to use at least three amplification stages to generate the third amplified RF signal.

7. The circuit of claim 1, wherein each of the main path and the bypass path comprises an input match network.

8. The circuit of claim 1, wherein each of the main path and the bypass path comprises an output match network.

9. The circuit of claim 1, wherein the main path and the bypass path are configured to share an input match network.

10. The circuit of claim 1, wherein the main path and the bypass path are configured to share an output match network.

11. The circuit of claim 1, wherein the main path comprises an inter-stage match network.

12. The circuit of claim 1, wherein the first, second, and third RF amplified signals are amplified by different amounts of gain.

13. The circuit of claim 12, wherein the amount of the gain of the third amplified signal comprises at least a portion of the amounts of gain of the first and second amplified signals.

14. The circuit of claim 1, wherein the coupling switch is coupled between an output of the bypass path and an input of the first plurality of amplification stages of the main path.

15. A power amplification method, comprising:
   receiving an RF signal at an input node;
   amplifying the RF signal by selecting at least one path from both (1) at least a portion of a main path of a first plurality of amplification stages and (2) at least a portion of a bypass path of at least one second amplification stage, the at least a portion of the main path comprising a first amplifier and the at least a portion of the bypass path comprising a second amplifier;
   routing the RF signal from the input node through the second amplifier, a coupling switch, and the first amplifier, and out to an output node; and
   outputting an amplified RF signal amplified by the selected at least one path from the output node.

16. The method of claim 15, further comprising:
   first input matching the main path; and
   second input matching the bypass path.

17. The method of claim 16, wherein the first input matching and the second input matching are combined to provide shared input matching for both the main path and the bypass path.

18. The method of claim 15, further comprising:
   first output matching the main path; and
   second output matching the bypass path.

19. The method of claim 18, wherein the first output matching and the second output matching are combined to provide shared output matching for both the main path and the bypass path.

20. A power amplifier system comprising:
   a plurality of power amplifier (PA) circuits, each PA circuit including
   an input node configured to receive an RF signal;
   an output node configured to output an amplified RF signal; and
   a main path coupled between the input node and the output node, and including a first plurality of amplification stages to generate a first amplified RF signal;
   a shared bypass path configured to be shared among main paths of the plurality of PA circuits, the shared bypass path including at least one second amplification stage to generate a second amplified RF signal; and
   a coupling switch configured to reuse the shared bypass path to drive one of the main paths of the plurality of PA circuits to generate a third amplified RF signal, the coupling switch configured to couple an output of the shared bypass path to an input of the first plurality of amplification stages of the one main path.

21. The system of claim 20, further comprising a controller configured to control the coupling switch in each PA circuit to determine which PA circuit of the plurality of PA circuits is to use the shared bypass path.

22. The system of claim 20, further comprising a second coupling switch configured to reuse the shared bypass path to drive a second of the main paths of the plurality of PA circuits to generate a fourth amplified RF signal, the second coupling switch configured to couple the output of the shared bypass path to an input of the first plurality of amplification stages of the second main path, the one main path being different than the second main path.

23. An apparatus comprising:
means for receiving an RF signal at an input node;
means for amplifying the RF signal using means for selecting at least one path from both (1) at least a portion of a main path of a first plurality of amplification stages and (2) at least a portion of a bypass path of at least one second amplification stage, the at least a portion of the main path comprising a first means for amplifying and the at least a portion of the bypass path comprising a second means for amplifying;
means for routing the RF signal from the input node through the second means for amplifying, a coupling switch, and the first means for amplifying, and out to an output node; and
means for outputting an amplified RF signal amplified by the selected at least one path from the output node.

24. The apparatus of claim 23, further comprising:
first means for input matching the main path; and
second means for input matching the bypass path.

25. The apparatus of claim 24, wherein the first means for input matching and the second means for input matching are combined to provide shared input matching for both the main path and the bypass path.

26. The apparatus of claim 23, further comprising:
first means for output matching the main path; and
second means for output matching the bypass path.

27. The apparatus of claim 26, wherein the first means for output matching and the second means for output matching are combined to provide shared output matching for both the main path and the bypass path.

* * * * *